United States Patent
Venkatasubramanian et al.

(10) Patent No.: US 10,545,556 B2
(45) Date of Patent: Jan. 28, 2020

(54) FINE-GRAINED DYNAMIC POWER AND CLOCK-GATING CONTROL

(71) Applicant: Texas Instruments Incorporated, Dallas, TX (US)

(72) Inventors: Rama Venkatasubramanian, Plano, TX (US); Jose Flores, Richardson, TX (US); Ivan Santos, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 189 days.

(21) Appl. No.: 15/591,823

(22) Filed: May 10, 2017

(65) Prior Publication Data
US 2018/0329471 A1 Nov. 15, 2018

(51) Int. Cl.
*G06F 1/26* (2006.01)
*G06F 1/32* (2019.01)
*G06F 1/3206* (2019.01)
*H03K 19/00* (2006.01)
*G06F 1/3237* (2019.01)
*G06F 1/3287* (2019.01)
*G06F 1/3234* (2019.01)
(Continued)

(52) U.S. Cl.
CPC .......... *G06F 1/3206* (2013.01); *G06F 1/3237* (2013.01); *G06F 1/3275* (2013.01); *G06F 1/3287* (2013.01); *H03K 19/0016* (2013.01); *H03K 3/0372* (2013.01); *H03K 19/20* (2013.01)

(58) Field of Classification Search
None
See application file for complete search history.

(56) References Cited

U.S. PATENT DOCUMENTS 6,434,704 B1 * 8/2002 Dean .................. G06F 1/10
713/320
7,068,080 B1 * 6/2006 Sanders .............. H03K 3/012
326/93

(Continued)

OTHER PUBLICATIONS

Smitha Sundaresan, et al., "Analysis of Power Savings from Intelligent Clock Gating", XILINX, XAPP790 (v1.0) Aug. 13, 2012, Application Note: 7 Series FPGAs, www.xilinx.com.
(Continued)

*Primary Examiner* — Nitin C Patel
(74) *Attorney, Agent, or Firm* — Ebby Abraham; Charles A. Brill; Frank D. Cimino (57) ABSTRACT

An IC includes logic groups each including a launch and a capture FF with a logic cloud in between. A power switch is in series with a power supply node of the logic groups. The logic groups have a clock-gating and power control (PCGC) block for dynamically generating a power supply enable (PS_EN) signal output coupled to a control node of the power switch and a clock output (CLK_OUT) signal coupled to a clock input of the launch or capture FF for clocking the logic groups. The PCGC blocks receive an EN signal and a CLK_IN signal and dynamically generate the PS_EN signal and CLK_OUT signals. During clock cycles at least one logic group(s) does not contribute to an intended logic result for the IC the CLK_OUT signal disables switching of at least a portion of the logic group(s) while the PS_EN signal turns off power to the logic group(s).

8 Claims, 8 Drawing Sheets

(51) Int. Cl.
*H03K 3/037* (2006.01)
*H03K 19/20* (2006.01)

(56) References Cited

U.S. PATENT DOCUMENTS

| | | | | |
|---|---|---|---|---|
| 7,587,686 | B1* | 9/2009 | Schleicher, II | G06F 17/505 |
| | | | | 716/100 |
| 7,958,483 | B1* | 6/2011 | Alben | G06F 1/3203 |
| | | | | 713/322 |
| 2009/0259862 | A1* | 10/2009 | Bulusu | G06F 1/3203 |
| | | | | 713/322 |
| 2010/0174933 | A1* | 7/2010 | Lu | G06F 1/3203 |
| | | | | 713/324 |
| 2013/0194016 | A1* | 8/2013 | Wimer | H03K 19/0016 |
| | | | | 327/199 |
| 2013/0332758 | A1* | 12/2013 | Sasaki | G06F 1/324 |
| | | | | 713/322 |
| 2014/0181556 | A1* | 6/2014 | Eckert | G06F 1/324 |
| | | | | 713/323 |
| 2015/0200652 | A1* | 7/2015 | Berzins | H03K 3/012 |
| | | | | 327/225 |
| 2015/0200669 | A1* | 7/2015 | Cai | H03K 3/356052 |
| | | | | 327/211 |
| 2016/0300546 | A1* | 10/2016 | Zheng | G09G 3/20 |
| 2017/0293340 | A1* | 10/2017 | Park | G06F 1/329 |
| 2018/0018118 | A1* | 1/2018 | Raghava | G06F 1/324 |

OTHER PUBLICATIONS

Raguram Damodaran, et al., "A 1.25GHz 0.8W C66x DSP Core in 40nm CMOS", 2012 25th International Conference on VLSI Design, Jan. 7-11, 2012, pp. 286-291.
James Myers, et al., Advanced Retention Power Gating: unlocking opportunistic leakage savings in high performance mobile SoCs, SNUG Silicon Valley, Mar. 25-28, 2013, Santa Clara Convention Center, ARM Ltd, Cambridge, UK, www.arm.com, pp. 1-17.

* cited by examiner

FINE-GRAINED DYNAMIC POWER AND CLOCK-GATING CONTROL

FIELD

Disclosed embodiments relate to power and clock-gating of integrated circuits having logic circuitry.

BACKGROUND

Dynamic power consumption is an ongoing concern for integrated circuit (IC) devices, especially with the ever-increasing clock frequencies used in synchronous IC devices. One known technique to reduce the dynamic power consumption of clock distribution networks is to employ clock-gating circuits (CGC) that selectively gate a number of clock signals on the IC device. More specifically, clock-gating circuits may reduce power consumption by selectively disabling portions of the clock tree so that circuit elements such as latches and/or flip-flops (FFs) associated with the disabled portions do not switch between logic high and low states. Preventing such latches and/or FFs from toggling between their respective logic states may significantly reduce dynamic power consumption of the IC device.

Clock-gating is performed at a fine-grained register-group level, whereas power gating is performed globally at an entire hardmacro (or) subchip level. Clock-gating is implemented in hardware for processors or accelerators based on the functional activity during respective clock cycles in the particular logic design. At such fine-grained level, clock-gating reduces the dynamic power.

SUMMARY

This Summary briefly indicates the nature and substance of this Disclosure. It is submitted with the understanding that it will not be used to interpret or limit the scope or meaning of the claims.

Disclosed embodiments recognize although clock-gating is known for the fine-grained level (gating to turn-off selected specific logic groups to eliminate switching between logic high and logic low states) to reduce the dynamic power of an IC that includes digital logic, it is recognized in high performance processors and in high performance technology nodes the leakage power (static power) can still be significant. It is recognized that known clock-gating at the fine-grained level can reduce dynamic power but cannot reduce leakage because the full power supply voltage is still being applied across the devices. There is thus no fine-grained leakage power reduction technique believed to be currently available.

Disclosed embodiments feature dynamic 'fine-grained' power and clock-gating control for ICs having digital logic (e.g., processor ICs) that comprise a plurality of logic groups, each logic group including a launch FF, a capture FF, and a logic cloud in between the launch and capture FFs. Disclosed fine-grained power and clock-gating control may be contrasted with conventional power gating which is performed globally at an entire hardmacro (or) subchip level, or alternatively conventional clock-gating which is performed at a fine-grained register-group level.

At least one power switch having a control node is in series between respective logic groups and their positive or negative power supply node. Each logic group also has an associated power and clock-gating control (PCGC) block for dynamically generating a clock output (CLK_OUT) signal from a received clock input (CLK_IN) signal and a power supply enable (PS_EN) signal from a received enable (EN) signal. The CLK_OUT signal is coupled to a clock input of the launch FF or capture FF and the PS_EN signal is coupled to the control node. During each of the clock cycles the respective CLK_OUT signals disable switching of at least a portion of those logic group(s) that do not contribute to a result of the IC while the respective PS_EN signal turns off power to the portion of those same logic group(s) by turning off their associated power switch.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1A:
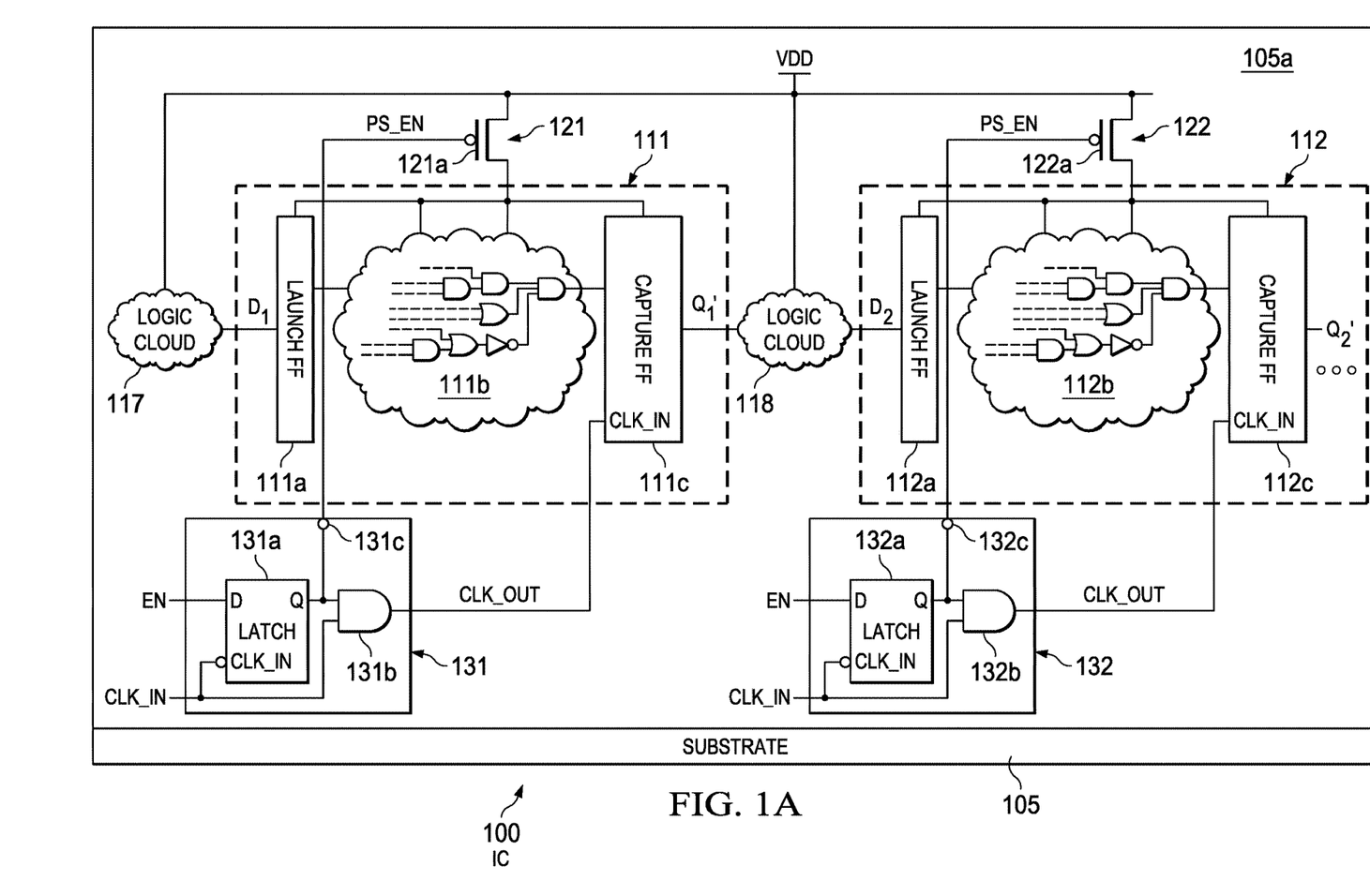
FIG. 1A depicts an IC having digital logic including a plurality of logic groups each including at least one power switch having a control node that is in series between respective logic groups and their positive or negative power supply node, where the logic groups each have a PCGC block that provides a signal which controls the switching of the logic groups and another signal controls the state of their power switch to turn off both power and switching to only at least a portion of those logic groups that do not contribute to a result of the IC during each clock cycle, according to an example embodiment.

FIG. 1A depicts an IC 100 that implements fine-grained dynamic power and clock-gating for its digital logic formed on a substrate 105 having a semiconductor surface 105a. The substrate 105 and/or its semiconductor surface 105a can comprise silicon, silicon-germanium, or other semiconductor material. The IC 100 comprises digital logic including a plurality of logic groups shown as logic groups 111, 112 each shown as a logic cloud between a launch FF and a capture FF. As used herein a 'logic cloud' includes at least one logical circuit and generally a plurality of interconnected logical circuits, with the logic cloud being shown as 111b for logic group 111 and 112b for logic groups 112 each by a simplified example having interconnected AND gates, OR gates, and an inverter. The FFs can generally be any FF type or FF combination, selected from RS, D, JK, T master/slave FFs, 3 to 64 typical FFs in groups. The FFs can be either negative or positive triggered FFs.

As used herein a launch FF when having an associated PCGC block has the combined logic called a fan-out cone, whereas for a capture FF when having an associated PCGC block having the combined logic is called a fan-in cone. In this use of nomenclature herein, in disclosed arrangements a logic cloud driven by a FF's output is the fan-out case (see FIG. 3B described below) and a logic cloud driving a FF's input is the fan-in case (see FIG. 3A described below).

In FIG. 1A the launch FFs 111a, 112a, the capture FFs 111c, 112c and the logic clouds 111b, 112b in each logic group 111, 112 between the launch FF and capture FF are connected to VDD by a single power switch 121 (for logic group 111), power switch 122 (for logic group 112), and a single PCGC block 131 (for logic group 111) and PCGC block 132 (for logic group 112) which provides both the PS_EN and CLK_OUT signals that controls an entire logic group. Disclosed logic clouds such as logic cloud 111b, 112b can comprise logic configured as a conventional fanin cone (a plurality of inputs with one output), conventional fanout cone (one output and a plurality of outputs), or both a conventional fanin cone and a conventional fanout cone. Most commonly the logic clouds will include both a conventional fanin cone(s) and a conventional fanout cone(s).

Each power switch 121, 122 has a control node 121a, 122a that is in series between respective logic groups 111, 112 and their positive or negative power supply node, with the power switches shown only for example in the FIGs. provided as p-channel metal-oxide-semiconductor (PMOS) devices which have gates as their control node with their sources at a node coupled to the positive supply shown in FIG. 1A as VDD. The size (area) of the power switches 121, 122 is generally based on the amount of current to be drained and the IR drop requirements for the particular IC design.

A logic cloud 117 is shown coupled to the D1 input of launch FF 111a of logic group 111 and a logic cloud 118 is shown coupled to the D2 input of the launch FF 112a of logic group 112. The Q output of the capture FF 111c shown as Q1' is shown coupled to the D input of the launch FF 112a shown as $D_2$ by the logic cloud 118.

PCGC block 131 includes a gated latch 131a (for logic group 111) and PCGC block 132 includes gated latch 132a (for logic group 112), where the gated latches are coupled to at least one logic gate shown in FIG. 1A as an AND gate 131b, 132b and an inverter 131c, 132c. The PCGC blocks are for dynamically generating outputs including a power supply enable (PS_EN) signal (at the output of the inverter 131c, 132c) and a clock output (CLK_OUT) signal at the output of the AND gate 131b, 132b, from an enable (EN) signal and a clock input (CLK_IN) signal shown received. A 'latch' as used herein refers to a bi-stable electronic logic circuit, i.e., a logic circuit having two stable states, where the circuit can be used to store one bit of data. The PCGC blocks 131, 132 receive independent EN and CLK-IN signals. Typically the CLK_IN is received from a phase lock loop (PLL) and the EN signal from logic gates, with separate signals for the respective logic groups 111, 112 to enable operating independently of one another.

The inverters 131c, 132c is only an example of logic that can be used to generate the PS-EN signal from a q output of the latch, and other logic can be used. The PS_EN signal is coupled to the control nodes 121a, 122a of the power switches shown as gates and the CLK_OUT signal is coupled to a clock input of the capture FFs 111c, 112c. As described above, during each of the clock cycles the CLK_OUT signal disables switching of only those logic groups that do not contribute to a result of the IC while the PS_EN signal turns off power to those same logic groups by turning off their associated power switch.

Figure 1B:
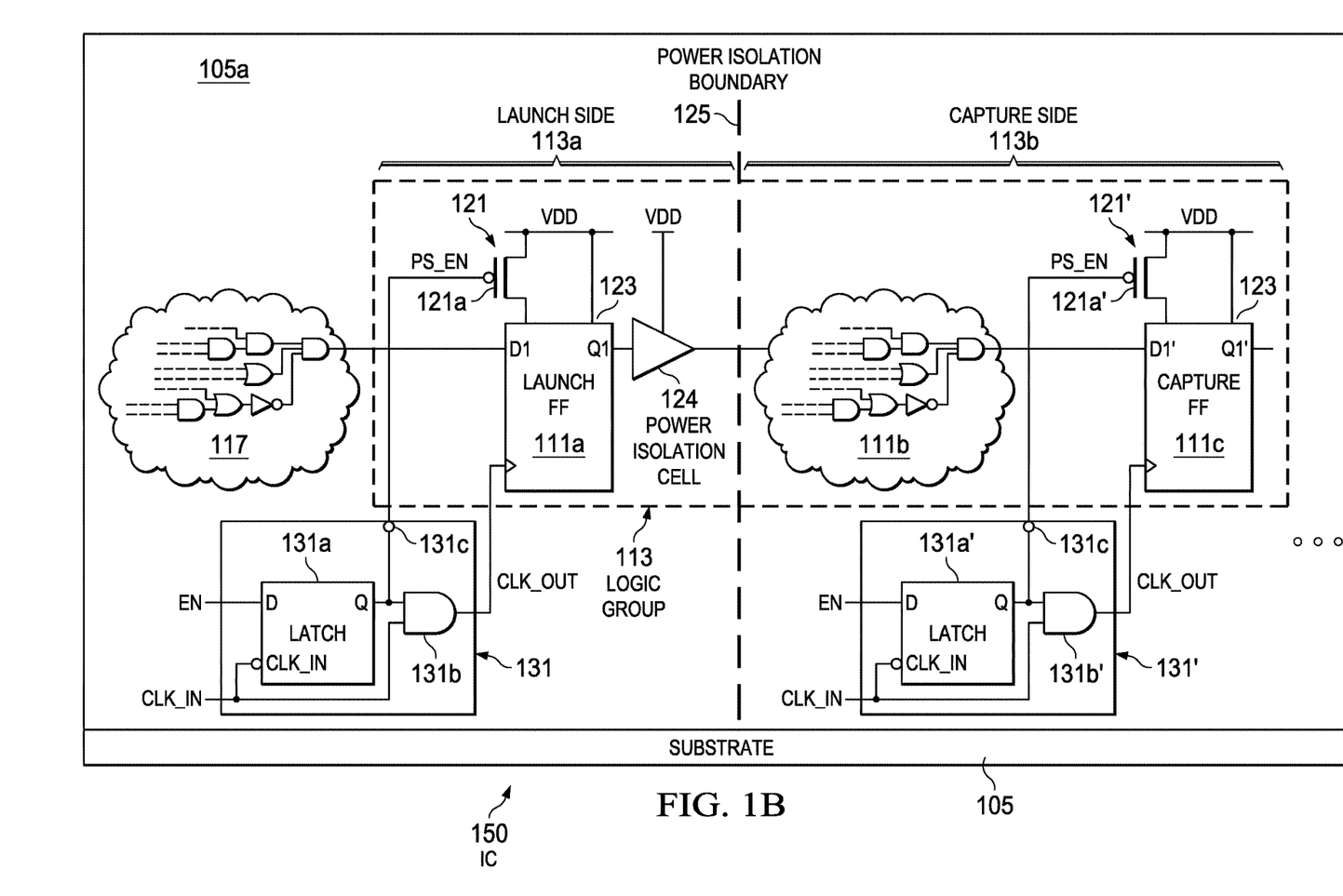
FIG. 1B depicts an IC having digital logic that shows a single logic group which further comprises a power isolation cell between its launch FF and the logic cloud of its capture FF, as well as a FF retention supply node for providing an always on power supply shown to both a node in both the launch FF and the capture FF to enable retaining the state of the FFs when the rest of the logic in the respective FF is being fine-grained dynamic power and clock-gated, according to an example embodiment.

FIG. 1B depicts an IC 150 having digital logic that shows a single logic group 113 which further comprises a power isolation cell 124 between the launch FF 111a and the logic cloud 111b of the capture FF 111c, where the FFs 111a, 111c include a retention supply node 123 for providing an always ON power supply to enable retaining the state of the FFs when the rest of the logic in the respective FF is being fine-grained dynamic power and clock-gated. Typically, the slave latch in the FF is kept powered on during disclosed fine-grained dynamic power-gating, with the other logic in the FF being fine-grained dynamic power-gating gated off.

In this embodiment the launch side 113a of the logic group 113 on one side of the power isolation boundary 125 including the launch FF 111a and its logic cloud 117 coupled to the D1 input of the launch FF 111a includes a power switch 121 and a PCGC block 131 which controls the launch FF 111a and its power switch 121. The capture side 113b of the logic group 113 on the other side of the power isolation boundary 125 includes the capture FF 111c and its logic cloud 111b includes a power switch 121' having a control node 121a' and a PCGC block 131' which controls the capture FF 111c and its power switch 121'. PCGC block 131' includes gated latch 131a' and gate 131b'.

The power isolation cell 124 comprises a circuit that electrically isolates a power-gated domain (here launch FF 111a) from another power-gated (or) always-ON domain, here the logic cloud 111b. The power isolation cell 124 provides the power isolation boundary 125 shown which provides a logical barrier between these adjacent power-gated domains. For example, the power isolation cell 124 can comprise any structure that provides both a logical barrier and electrical barrier between an ON and OFF boundary. There are a variety of publications (e.g., papers and patents) disclosing various power isolation cells that are all generally suitable to be used with disclosed embodiments, such as being reverse biased diode-based cells during operation for the power isolation portion.

Figure 2:
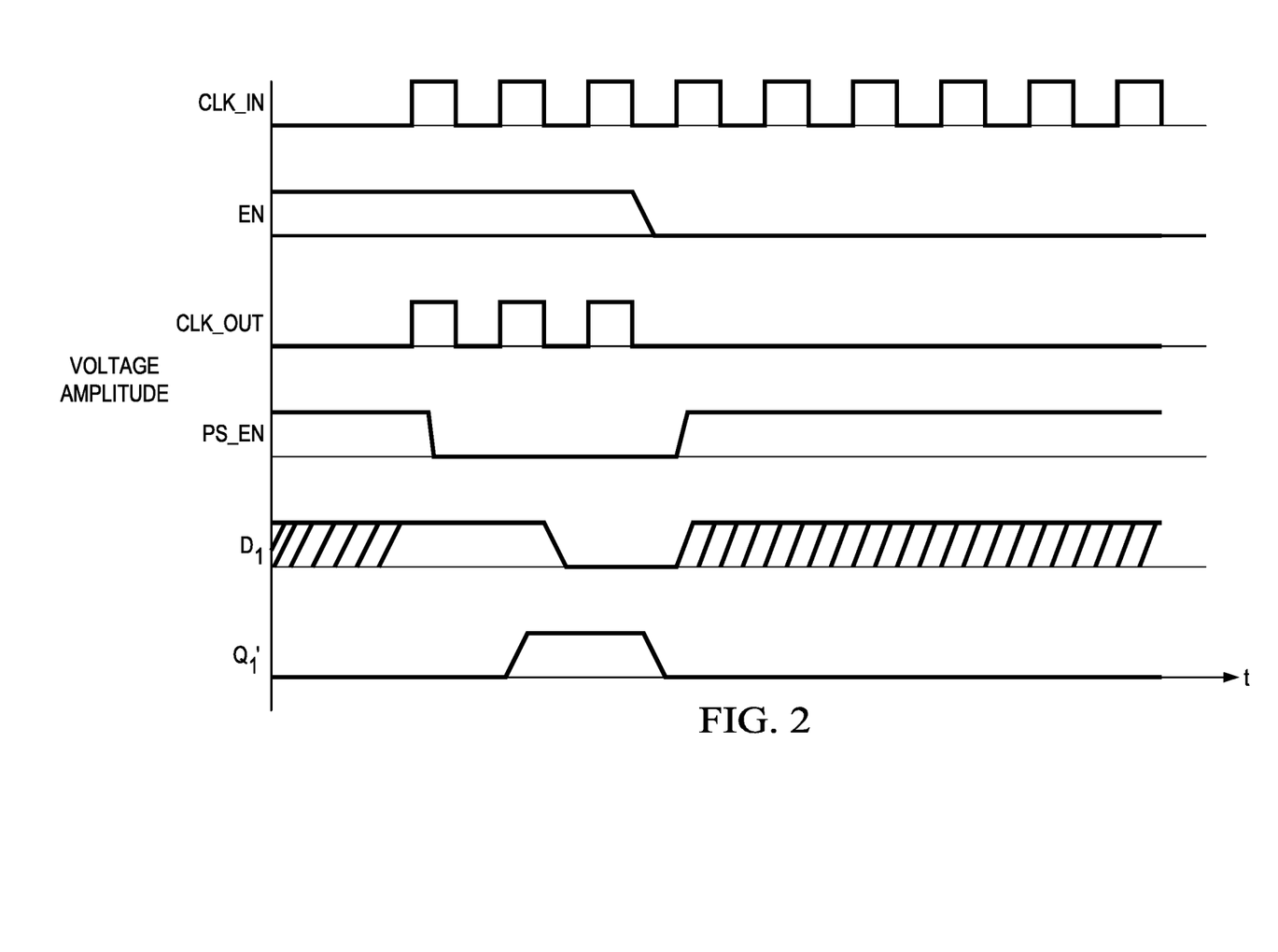
FIG. 2 shows an example timing diagram for the respective signals and at some the nodes for the logic group shown in FIG. 1A.

FIG. 2 shows an example timing diagram for the respective signals and at some the nodes shown for the logic group 111 of IC 100 shown in FIG. 1A, according to an example embodiment. CLK_IN, EN, CLK_IN', PS_EN, CLK_OUT and D1 and Q1' signals are shown. The PS_EN output generated by PCGC block 131 can be seen to be synchronized with CLK_OUT signal which is a function of CLK-IN and EN. The PS_EN signal is logic low (thus power switch 121 being a PMOS device is turned ON) when the CLK_OUT signal is active enabling logic group 111 so that Q1' is logic high to reflect data being received at D1 when CLK_OUT is active (logic group 111 is active). The PS_EN signal is logic high (thus power switch 121 being a PMOS device is turned off) when the CLK_OUT signal is inactive disabling logic group 111 so that Q1' is logic low to reflect CLK_OUT signal being inactive independent of data being received at D1 (logic group 111 is not active). The hatching shown for a part of the D1 signal is used to indicate that multiple toggles of the D input can occur during the window of time CLK_OUT signal is inactive (PS_EN is logic high).

Figure 3A:
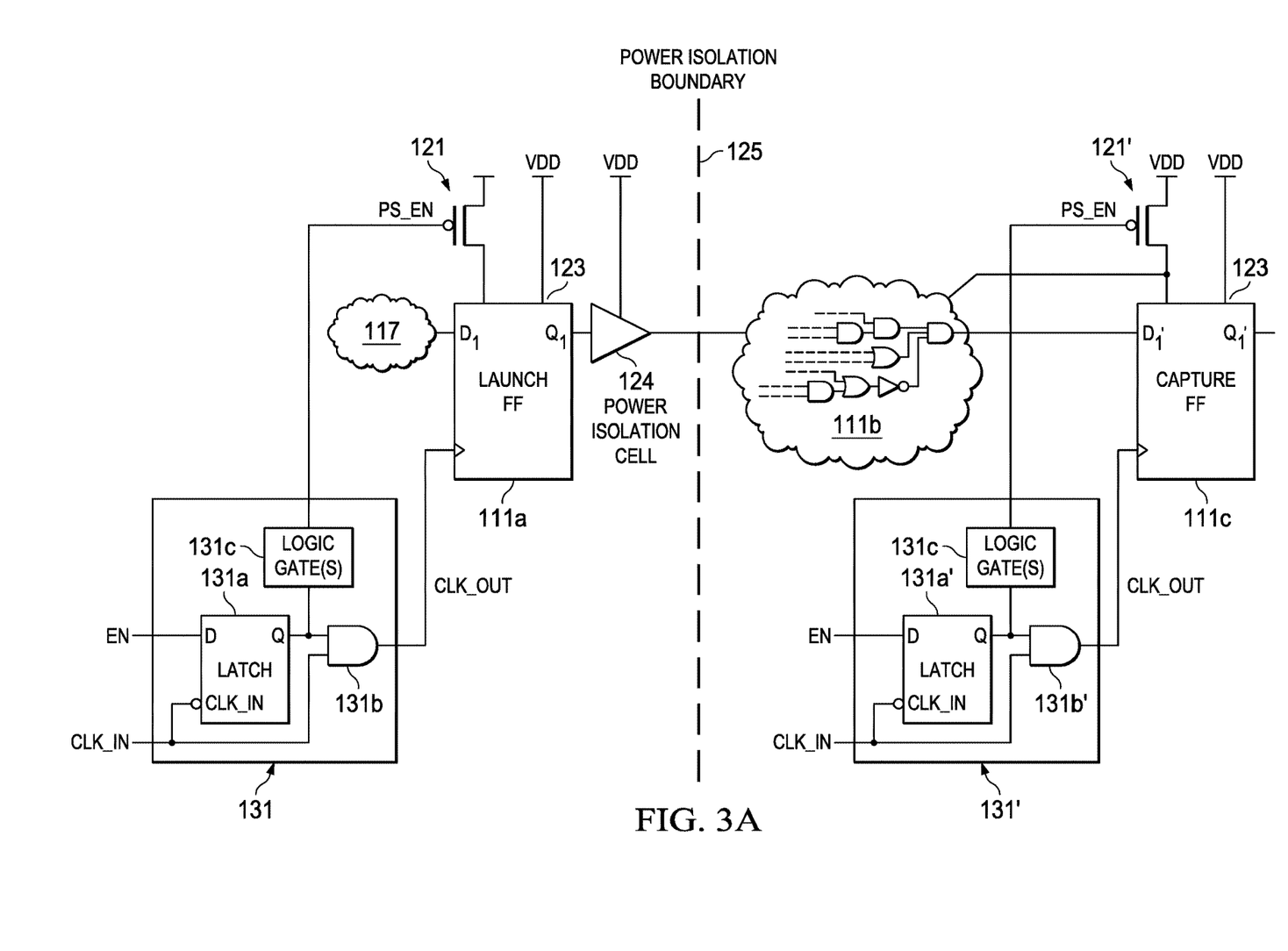
FIG. 3A shows an approach for disclosed fine-grained dynamic power and clock-gating performed on the capture FF and its associated logic cloud, wherein a CLK_OUT signal from a PCGC block is coupled to a clock input of the capture FF that has an associated power switch and the capture FF's associated logic cloud is also coupled to receive power through the same power switch.

FIG. 3A shows a first approach of power gating for disclosed fine-grained dynamic power and clock-gating performed on the capture side using a capture FF 111c and its associated logic cloud 111b (a fan-in case). The FFs 111a, 111c are each shown including a retention supply node 123. A CLK_OUT signal from a PCGC block 131' is coupled to a clock input of the capture FF 111c that has an associated power switch 121', and the capture FF's 111c associated logic cloud 111b is coupled also receive power through the same power switch 121'. A power isolation cell 124 and power isolation boundary 125 is shown between the launch FF 111a and the logic cloud 111b. Advantages of this approach is that capture FF 111c can be power gated. In order to enable the power-gating the PS_EN signal from PCGC block 131' generally needs to reflect the combinatorial logic timing of the logic cloud 111b.

Figure 3B:
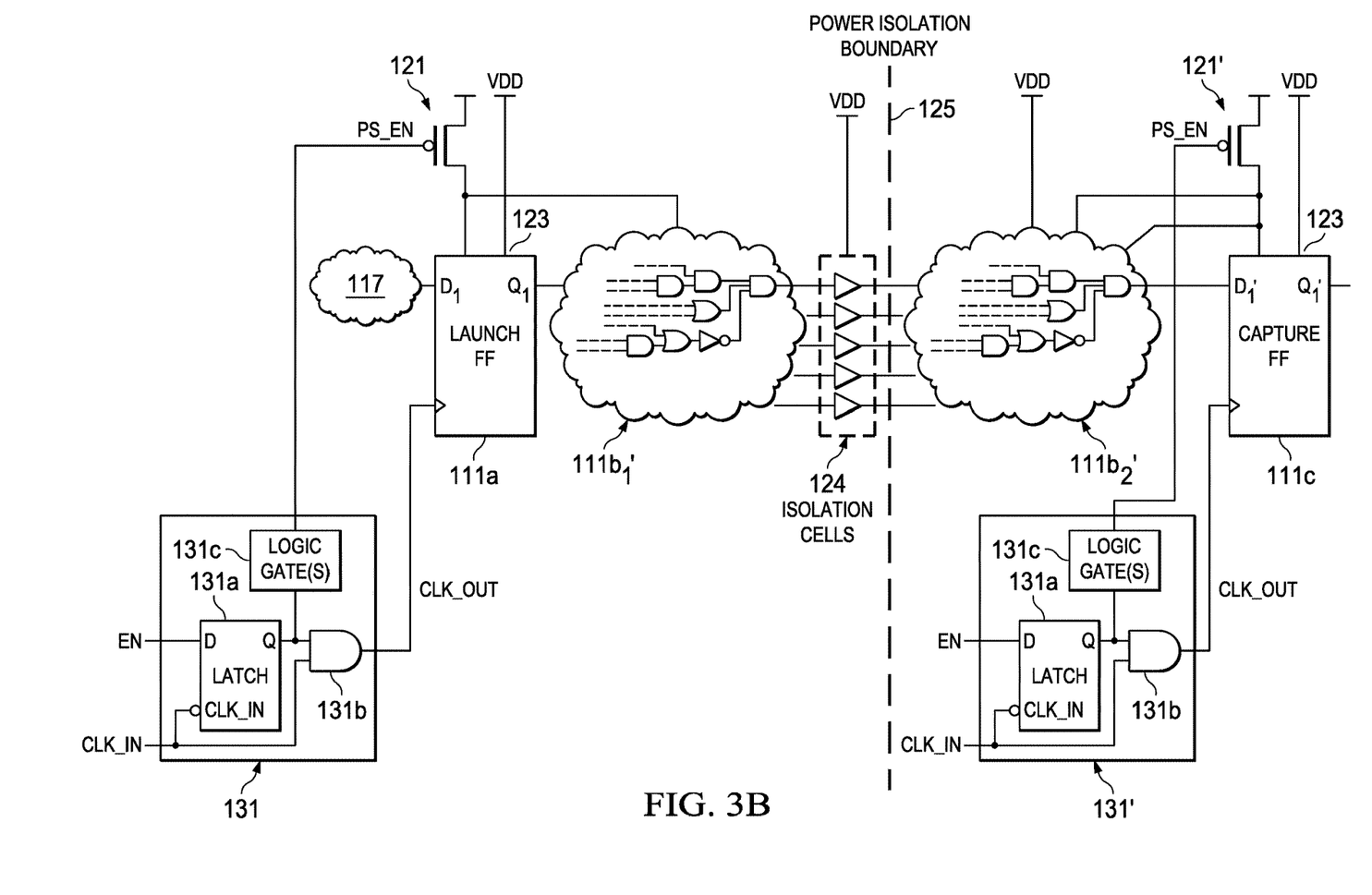
FIG. 3B shows an approach for disclosed fine-grained dynamic power and clock-gating performed on the launch FF and associated logic cloud wherein a CLK_OUT signal from a PCGC block is coupled to a clock input of the launch FF that has an associated power switch and at least a portion of the launch FF's associated logic cloud is also coupled to receive power through the same power switch.

Power gating can also be done on the launch side using a launch FF 111a and associated logic cloud. FIG. 3B shows a second approach of power gating for disclosed fine-grained dynamic power and clock-gating performed on the launch FF 111a and a logic cloud portion 111b1' of its associated logic cloud (a fan-out case) that also includes logic cloud portion 111b2'. The logic cloud portion 111b1' is shown separated from the other logic cloud portion 111b2' by isolation cells 124 that provide a power isolation boundary 125.

The FFs 111a, 111c are again shown including a retention supply node 123. A CLK_OUT signal from a PCGC block 131 is coupled to a clock input of the launch FF 111a that has an associated power switch 121', and the launch FF's 111a associated logic cloud portion 111b1' is coupled also receive power through the same power switch 121'. The other logic cloud potion 111b2' comprises logic that cannot be gated based on the intersection of its logic. An advantage of this arrangement is that the PS_EN time is not dependent on the combinatorial logic timing. A disadvantage of this arrangement is that the capture FF 111c cannot be power gated and the isolation cells 124 in the middle of the logic cloud portions 111b1', 111b2' cannot be gated (based on the intersection of the logic).

One example grouping criteria traverses back the logic cloud starting from the D input of the FF and gathers cells that uniquely feed that FF. For example, if a combinatorial cell feeds more than one FF, it can be placed in a different group, where the PS_EN of the respective FF PCGC blocks may be AND'ed or can be otherwise synchronized.

Figure 4A:
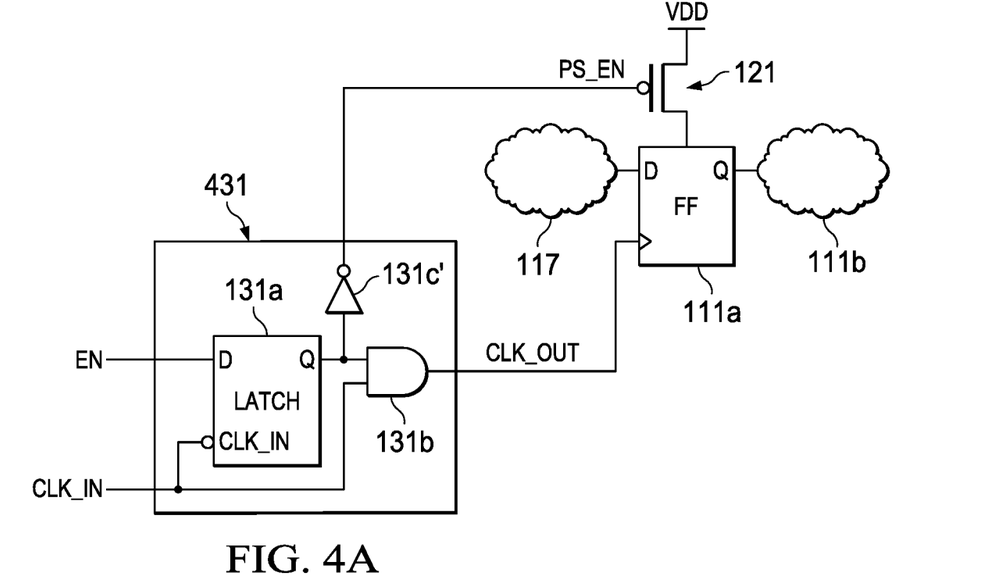
FIG. 4A shows first example logic comprising an inverter for a PCGC block for generating the PS_EN signal for which a timing description is provided.

FIG. 4A shows first example logic comprising an inverter 131c' for a PCGC block 431 generating the PS_EN signal for which a timing discussion is provided. The PS-EN signal from the PCGC control block 431 is used to control the power switch 121. A combinatorial logic delay should generally be added between the inverter 131c' and the power switch 121 to add enough time delay to avoid the power switch 121 being power gated prematurely resulting in data not being captured on time.

Figure 4B:
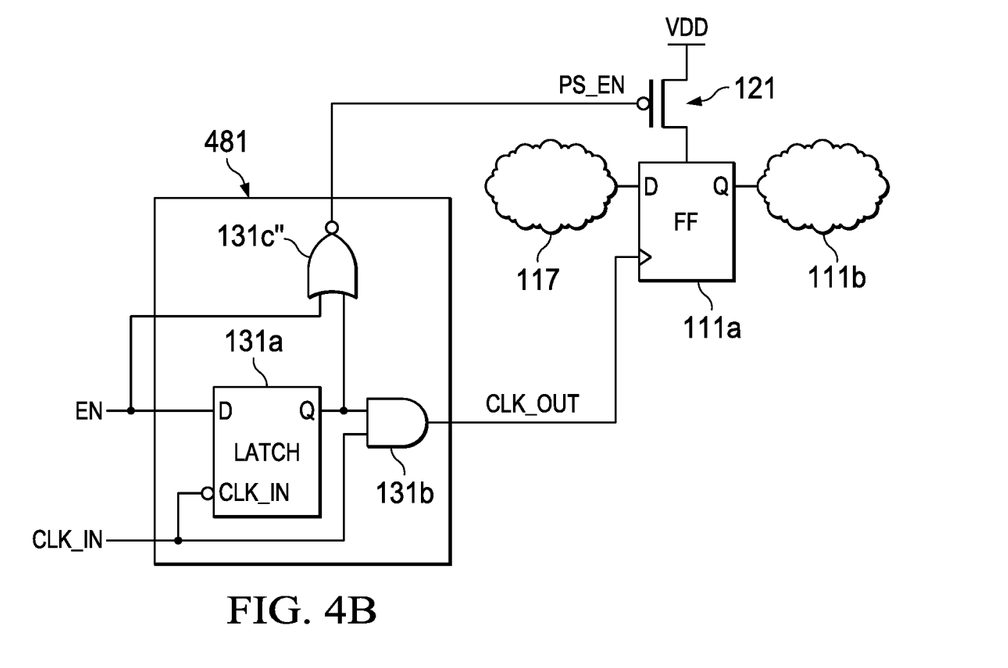
FIG. 4B shows second example logic comprising a NOR2 gate for a PCGC for generating the PS_EN signal for which a timing description is provided.

FIG. 4B shows second example logic comprising a NOR2 gate 131c" for a PCGC block 481 for generating the PS_EN signal for which a timing discussion is provided. The PS_EN signal output by NOR2 gate 131c" removes the dependency of combinatorial logic on the setup. This results in an IC area increase by one NOR2 gate. An advantage is that the combinatorial delay need not be factored into the power switch 121 setup time as in the arrangement in FIG. 4A.

Figure 5:
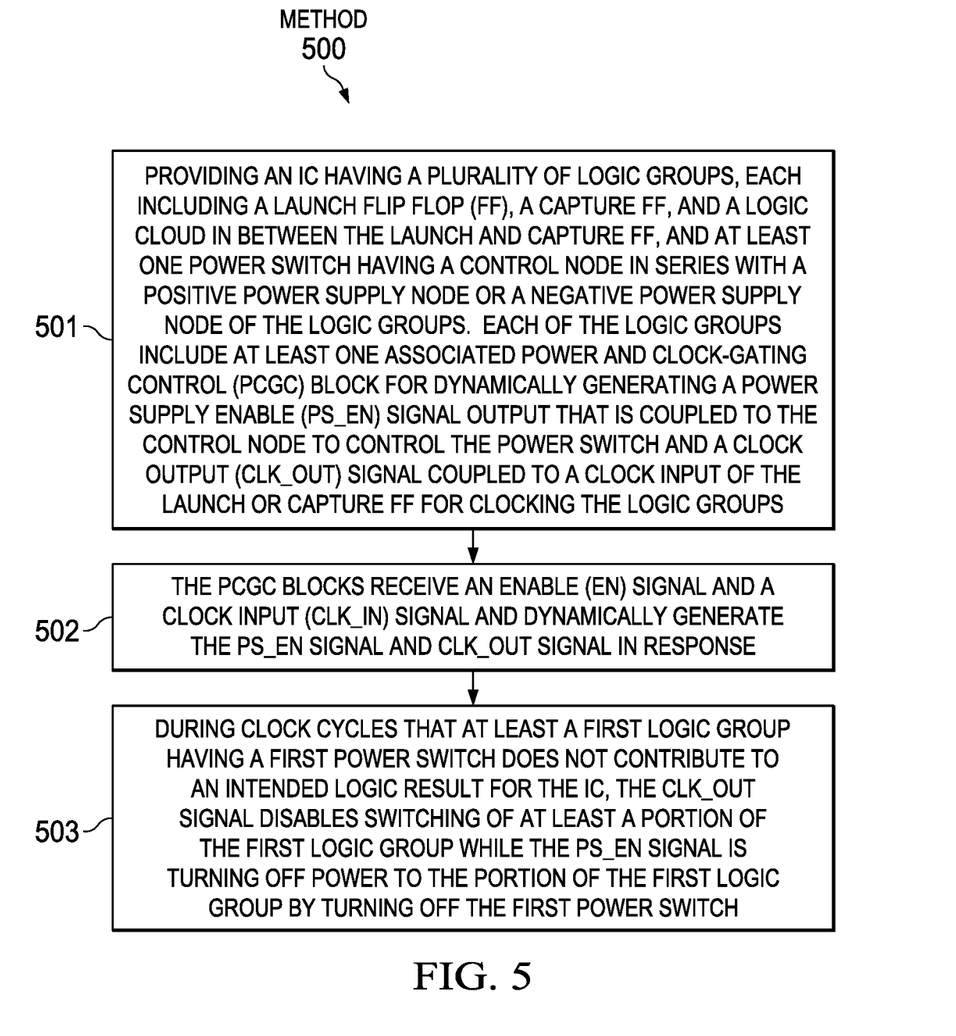
FIG. 5 is a flow chart that shows steps in an example method of fine-grained dynamic power and clock-gating, according to an example embodiment.

FIG. 5 is a flow chart that shows steps in an example method 500 of fine-grained dynamic power and clock-gating, according to an example embodiment. Step 501 comprises providing an IC having a plurality of logic groups each including a launch FF, a capture FF, and a logic cloud in between the launch and capture FF, and at least one power switch having a control node in series with a positive power supply node or a negative power supply node of the logic groups. Each of the plurality of logic groups include at least one associated PCGC block for generating a CLK_OUT signal coupled to a clock input of the launch FF or capture FF for clocking the logic groups and a PS_EN signal output that is coupled to the control node to control the power switch. Step 502 comprises the PCGC blocks receiving an EN signal and a CLK_IN signal and dynamically generating or providing the CG input to the logic gate for generating the PS_EN signal and CLK_OUT signal in response. In step 503, during clock cycles that at least a first logic group having a first power switch does not contribute to an intended logic result for the IC, the CLK_OUT signal disables switching of a least a portion of the first logic group while the PS_EN signal is turning off power to the portion of the first logic group by turning off the first power switch.

Figure 6:
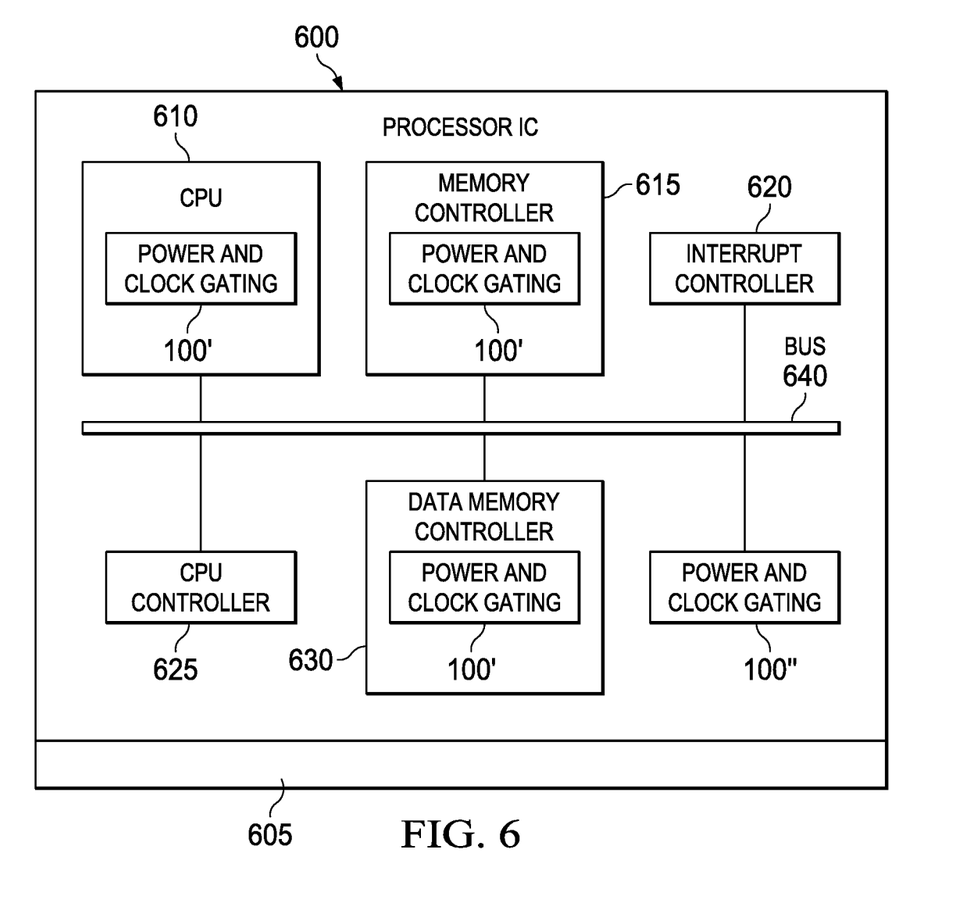
FIG. 6 is a block diagram depiction of processor IC comprising a plurality of blocks that implements disclosed fine-grained dynamic power and clock-gating.

FIG. 6 is a block diagram depiction of processor IC 600 formed on a substrate 605 having at least a semiconductor surface that comprises a plurality of blocks in which some of the blocks implement disclosed fine-grained dynamic power and clock-gating by including a fine-grained power gating block shown as 100' for at least some of its digital logic. Processor IC 600 is shown including a central processing unit (CPU) 610 having a fine-grained power gating block 100', a program memory controller 615 having a fine-grained power gating block 100', interrupt controller 620, CPU controller 625, and data memory controller 630 having a fine-grained power gating block 100', as well as a stand-alone fine-grained power gating block shown as 100" all coupled together by at least one bus shown as bus 640.

EXAMPLES

Disclosed embodiments are further illustrated by the following specific Examples, which should not be construed as limiting the scope or content of this Disclosure in any way.

An experiment was run to determine the energy (power) savings resulting from using disclosed fine-grained dynamic power and clock-gating for a CMOS digital signal processor (DSP) IC with a fixed and floating point CPU with Level-1 and Level-2 cache memory formed on a bulk silicon substrate with an epitaxial layer thereon. The frequency of operation was 600 MHz @ 1V (Power Supply), and the DSP IC had 220 k gates. The minimum gate size on the DSP IC was 28 nm. Simulated results are shown below:

| Toggle Rate (%) | No. of Groups | No. of Grouped Cells | Increased Area (%) | Energy Savings (%) |
|---|---|---|---|---|
| 12.5 | 653 | 70920 | 4.6 | 46 |
| 25.0 | 622 | 68221 | 4.3 | 37 |

A 37% (for a toggle rate of 25%) to 46% (for a toggle rate of 12.5%) energy savings as shown was demonstrated to be realized with only a 4% to 5% increase in die area for the IC (mostly due to the area for the added power switches).

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An integrated circuit (IC), comprising:
   a gated latch having an enable input, a clock input, and an output;
   an inverter having an input and an output, the inverter input is coupled to the gated latch output;
   an AND gate having a first input, a clock input, and an output, the first input coupled to the gated latch output, and the clock input is coupled to the gated latch clock input;
   a flip flop having a first input, a clock input and an output, and the flip flop clock input is coupled to the AND gate output;
   a power isolation cell having an input coupled to the flip flop output; and
   a switch having a first terminal and a second terminal, the switch first terminal is coupled to the inverter output and the switch second terminal is coupled to the flip flop first input.

2. The IC of claim 1, wherein the switch is a transistor.

3. The IC of claim 1, wherein the flip-flop has a second input; and further comprising a logic gate coupled to the flip-flop second input.

4. The IC of claim 3, wherein:
   the logic group has an input; and
   the power isolation cell having an output that is coupled to the logic group input.

5. The IC of claim 1, wherein the power isolation cell has an input and the flip flop is a second flip flop; and
   further comprising a first flip flop having an output that is coupled to the power isolation cell input.

6. The IC of claim 5, wherein the first flip flop has an input and the logic group is a second logic group; and
   further comprising a first logic group having an output that is coupled to the first flip flop input.

7. The IC of claim 6, wherein the first flip flop has a clock input, the AND gate is a second AND gate, and the gated latch is a second gated latch; and
   further comprising:
   a first AND gate having an output coupled to the first flip flop clock input, a first input, and a second input adapted to receive the clock signal; and
   the first gated latch having an enable input, a clock input adapted to receive the clock signal, and an output coupled to the first AND gate first input.

8. The IC of claim 7, wherein the first flip flop has a supply node, the power switch is a second power switch; and
   further comprising a first power switch having a control node coupled to the output of the first gated latch and a channel node coupled to the first flip flop supply node.

* * * * *